(12) United States Patent
Yao et al.

(10) Patent No.: US 9,324,596 B2
(45) Date of Patent: Apr. 26, 2016

(54) SUBSTRATE STORAGE RACK

(71) Applicant: SHENZHEN CHINA STAR OPTOELECTRONICS TECHNOLOGY CO., LTD., Shenzhen (CN)

(72) Inventors: Jiangbo Yao, Shenzhen (CN); Chunliang Lee, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/240,332

(22) PCT Filed: Jan. 17, 2014

(86) PCT No.: PCT/CN2014/070753
§ 371 (c)(1),
(2) Date: Feb. 21, 2014

(87) PCT Pub. No.: WO2015/032174
PCT Pub. Date: Mar. 12, 2015

(65) Prior Publication Data
US 2015/0155191 A1 Jun. 4, 2015

(30) Foreign Application Priority Data
Sep. 9, 2013 (CN) .......................... 2013 1 0408422

(51) Int. Cl.
*A47G 19/08* (2006.01)
*H01L 21/673* (2006.01)
*B25H 3/04* (2006.01)

(52) U.S. Cl.
CPC ............ *H01L 21/67326* (2013.01); *B25H 3/04* (2013.01)

(58) Field of Classification Search
CPC ..................... H01L 21/6734; H01L 21/67343; B65D 85/48; B65G 49/062; H05K 13/0069
USPC ........... 211/41.18, 41.1, 41.14; 206/454, 710, 206/711, 707
See application file for complete search history.

(56) References Cited

U.S. PATENT DOCUMENTS 4,184,841 A * 1/1980 Robinson et al. ............. 432/258
4,815,601 A * 3/1989 Peterson et al. .............. 206/454
(Continued)

FOREIGN PATENT DOCUMENTS

CN 1616319 A 5/2005
CN 1636840 A 7/2005
(Continued)

OTHER PUBLICATIONS

International Search Report dated Mar. 20, 2014, issued to the corresponding International Application No. PCT/CN2014/070753.

*Primary Examiner* — Joshua Rodden
*Assistant Examiner* — Kimberley S Wright
(74) *Attorney, Agent, or Firm* — Stein IP, LLC (57) ABSTRACT

The present disclosure relates to a substrate storage rack, including a hollow rack body with a first, a second, a third, and a fourth lateral surfaces, wherein at least one substrate laying layer is arranged in the rack body along a vertical direction. The substrate laying layer includes: a first support connected with the rack body and arranged at the second lateral surface; first supporting bars transversely arranged on the first support and extending to the interior of the rack body; a second support connected with the rack body and arranged at the fourth lateral surface; and second supporting bars transversely arranged on the second support and extending to the interior of the rack body. Since the first and the second supporting bars are arranged on the second and the fourth lateral surfaces of the rack body respectively, storing substrates in the rack body can be ensured. Then, the first lateral surface can be used as a fetching and feeding port for an automatic manipulator arm and the fourth lateral surface can be used as a manual fetching and feeding port, so that bidirectional fetching and feeding of the substrates in the substrate storage rack can be realized, and thus the production efficiency can be effectively improved.

9 Claims, 4 Drawing Sheets

(56) References Cited

U.S. PATENT DOCUMENTS

| | | | |
|---|---|---|---|
| 4,930,634 A * | 6/1990 | Williams et al. | 206/454 |
| 5,393,226 A * | 2/1995 | Groom | 432/258 |
| 5,490,011 A * | 2/1996 | Pernick et al. | 359/601 |
| 5,785,186 A * | 7/1998 | Babbs et al. | 211/41.18 |
| 5,853,214 A * | 12/1998 | Babbs et al. | 294/161 |
| 5,890,598 A * | 4/1999 | Hayashida et al. | 206/710 |
| 6,155,426 A * | 12/2000 | Matsuda et al. | 206/708 |
| 6,186,344 B1 * | 2/2001 | Park et al. | 211/41.1 |
| 6,273,275 B1 * | 8/2001 | Kim et al. | 211/41.18 |
| 6,523,701 B1 * | 2/2003 | Yoshida et al. | 211/41.18 |
| 6,746,198 B2 * | 6/2004 | White et al. | 414/222.13 |
| 7,086,540 B2 * | 8/2006 | Huang et al. | 211/41.18 |
| 7,093,704 B2 * | 8/2006 | Gordon et al. | 198/345.2 |
| 7,163,110 B2 * | 1/2007 | Huang et al. | 211/41.18 |
| 7,188,736 B2 * | 3/2007 | Choi | 211/41.18 |
| 7,232,037 B2 * | 6/2007 | Jang | 211/41.14 |
| 7,246,708 B2 * | 7/2007 | Chuang et al. | 211/41.18 |
| 7,334,690 B2 * | 2/2008 | Huang et al. | 211/41.18 |
| 7,482,555 B2 * | 1/2009 | Liu et al. | 219/390 |
| 7,559,730 B2 * | 7/2009 | Song | 414/217 |
| 7,891,937 B2 * | 2/2011 | Mohamed | 414/810 |
| 7,978,279 B2 * | 7/2011 | Chung | 349/58 |
| 8,127,692 B2 * | 3/2012 | Choi | 108/59 |
| 8,800,774 B2 * | 8/2014 | Bonora | 206/710 |
| 2003/0121870 A1 * | 7/2003 | Beckhart et al. | 211/41.18 |
| 2003/0214614 A1 * | 11/2003 | Chung | 349/58 |
| 2004/0069680 A1 * | 4/2004 | Song | 206/711 |
| 2004/0069727 A1 * | 4/2004 | Huang et al. | 211/41.1 |
| 2004/0134831 A1 * | 7/2004 | Huang et al. | 206/711 |
| 2004/0145697 A1 * | 7/2004 | Yoshizawa et al. | 349/187 |
| 2004/0164035 A1 * | 8/2004 | Jang | 211/41.14 |
| 2004/0240974 A1 * | 12/2004 | Mohamed | 414/416.03 |
| 2005/0067360 A1 * | 3/2005 | Darvial | 211/41.14 |
| 2005/0127012 A1 | 6/2005 | Choi | 211/41.18 |
| 2006/0016709 A1 * | 1/2006 | Chen et al. | 206/448 |
| 2006/0040521 A1 * | 2/2006 | Gordon et al. | 439/66 |
| 2006/0182556 A1 * | 8/2006 | Liu et al. | 414/331.01 |
| 2006/0226093 A1 * | 10/2006 | Cho et al. | 211/41.14 |
| 2006/0226094 A1 * | 10/2006 | Cho et al. | 211/41.18 |
| 2006/0231515 A1 * | 10/2006 | Chou | 211/41.18 |
| 2007/0090065 A1 * | 4/2007 | Lin et al. | 211/41.14 |
| 2010/0224523 A1 * | 9/2010 | Yuasa et al. | 206/454 |
| 2010/0224524 A1 * | 9/2010 | Yuasa et al. | 206/454 |
| 2011/0100937 A1 * | 5/2011 | Mohamed | 211/41.18 |
| 2014/0231370 A1 * | 8/2014 | Han | 211/41.1 |
| 2014/0326686 A1 * | 11/2014 | Li et al. | 211/41.1 |

FOREIGN PATENT DOCUMENTS

| | | |
|---|---|---|
| CN | 201309690 Y | 9/2009 |
| CN | 201816963 U | 5/2011 |
| CN | 202138720 U | 2/2012 |
| CN | 202542094 U | 11/2012 |
| KR | 10-2008-0049254 A | 6/2008 |
| KR | 10-2011-0102678 A | 9/2011 |
| KR | 10-1252034 B1 | 4/2013 |
| TW | M253578 | 12/2004 |

\* cited by examiner

SUBSTRATE STORAGE RACK

FIELD OF THE INVENTION

The present disclosure relates to a plate storage rack, and particularly, relates to a substrate storage rack.

BACKGROUND OF THE INVENTION

With the continuous development and improvement of thin film transistor-liquid crystal display (TFT-LCD) technology, TFT-LCD is increasingly widely used in people's daily life.

Substrates are a main base material used in the process for producing TFT-LCD. To conveniently transport and treat the substrates in production lines, the substrates are always laid in a substrate storage rack at present. In use, the substrate storage rack is previously placed at a fetching position, and then the substrates disposed in the substrate storage rack in advance are taken out of the substrate storage rack by using an automatic manipulator arm, and then transported to a production line.

Currently, common substrate storage rack is generally provided with only one substrate access port. Therefore, after the substrate storage rack is placed in the fetching position, the substrates can be taken out from the access port only by using the automatic manipulator arm, and then transported to the production line. However, when the substrates need to be manually taken out of the substrate storage rack or substrates are newly filled into the substrate storage rack, due to the design of one substrate access port, the whole substrate storage rack has to be moved away from the fetching position by using a manually powered trolley, and then the substrates are manually taken out or the substrate storage rack is refilled. Therefore, the production efficiency is significantly affected.

SUMMARY OF THE INVENTION

Aiming at the above-mentioned defects in the prior art, the objective of the present disclosure is to provide a substrate storage rack, which can realize bidirectional fetching and feeding of substrates so as to effectively improve the production efficiency.

1) A substrate storage rack provided in the present disclosure includes a hollow rack body with a first lateral surface and a third lateral surface opposite to each other, and a second lateral surface and a fourth lateral surface opposite to each other, wherein at least one substrate laying layer is arranged in the rack body, and includes:

a first support connected with the rack body and arranged at the second lateral surface;

first supporting bars transversely arranged on the first support and extending to the interior of the rack body;

a second support connected with the rack body and arranged at the fourth lateral surface; and second supporting bars transversely arranged on the second support and extending to the interior of the rack body.

2) In a preferred embodiment of 1) of the present disclosure, a plurality of substrate laying layers are distributed in sequence within the rack body and spaced from each other at intervals along the vertical direction.

3) In a preferred embodiment of 1) or 2) of the present disclosure, a first limiting seat capable of moving transversely is arranged on each first supporting bar, and the first limiting seat includes a first limiting portion that can restrict the substrate; and a second limiting seat capable of moving transversely is arranged on each second supporting bar, and the second limiting seat includes a second limiting portion that can restrict the substrate.

4) In a preferred embodiment of 3) of the present disclosure, a plurality of groups of first locating holes are formed on each first supporting bar at intervals along the traverse direction, and each first limiting seat can be selectively matched and connected with one group of the first locating holes; and a plurality of groups of second locating holes are formed on each second supporting bar at intervals along the traverse direction, and each second limiting seat can be selectively matched and connected with one group of the second locating holes.

5) In a preferred embodiment of 3) of the present disclosure, a first sliding chute is transversely formed on each first supporting bar, and the corresponding first limiting seat can be matched and connected with the first supporting bar through the first sliding chute; and a second sliding chute is transversely formed on each second supporting bar, and the corresponding second limiting seat can be matched and connected with the second supporting bar through the second sliding chute.

6) In a preferred embodiment of any of 3) to 5) of the present disclosure, on each first limiting seat a first roller is arranged, the axis of which extends longitudinally and the peripheral surface of which is tangential with the first limiting portion; and on each second limiting seat a second roller is arranged, the axis of which extends longitudinally and the peripheral surface of which is tangential with the second limiting portion.

7) In a preferred embodiment of any of 1) to 6) of the present disclosure, the substrate laying layer further includes at least one third supporting bar longitudinally arranged on the third lateral surface through a third support, and the third supporting bar is arranged between the first supporting bars and the second supporting bars along the transverse direction.

8) In a preferred embodiment of 7) of the present disclosure, a third limiting seat capable of moving longitudinally is arranged on the third supporting bar, and the third limiting seat includes a third limiting portion that can restrict the substrate.

9) In a preferred embodiment of 8) of the present disclosure, a plurality of groups of third locating holes are formed on the third supporting bar at intervals along the longitudinal direction, and the third limiting seat can be selectively matched and connected with one group of the third locating holes.

10) In a preferred embodiment of 8) of the present disclosure, a third sliding chute is longitudinally formed on the third supporting bar, and the third limiting seat can be matched and connected with the third supporting bar through the third sliding chute.

11) In a preferred embodiment of any of 8) to 10) of the present disclosure, on the third limiting seat a third roller is arranged, the axis of which extends transversely and the peripheral surface of which is tangential with the third limiting portion.

12) In a preferred embodiment of any of 1) to 11) of the present disclosure, the rack body is provided with at least one vertically-arranged first supporting rod at the second lateral surface, and the first supporting rod is connected and fixed to the first support; and the rack body is provided with at least one vertically-arranged second supporting rod at the fourth lateral surface, and the second supporting frame is connected and fixed to the second support.

Compared with the prior art, the substrate storage rack provided in the present disclosure has the following advantages. Since the first supporting bars and the second supporting bars are arranged on the second lateral surface and the fourth lateral surface of the rack body respectively to form the substrate laying layer, storing substrates in the rack body can be ensured. Then, the first lateral surface can be used as a fetching and feeding port for an automatic manipulator arm and the fourth lateral surface can be used as a manual fetching and feeding port, so that bidirectional fetching and feeding of the substrates in the substrate storage rack can be realized, and thus the production efficiency can be effectively improved.

In a further technical solution, by providing a plurality of substrate laying layers, the quantity of the substrates stored in the substrate storage rack can be increased. Therefore, the feeding quantity of the substrates can be increased, so that the substrates can be conveniently used in a production line.

In a further technical solution, the first limiting seat capable of moving is arranged on each first supporting bar, and the second limiting seat capable of moving is arranged on each second supporting bar. Therefore, the substrates with different sizes can be well laid by adjusting the distance between the first liming seat and the second limiting seat, so that the use range of the substrate storage rack can be broadened.

In a further technical solution, movement of the first limiting seat on the first supporting bar is realized through the first locating holes at different positions, and similarly, movement of the second limiting seat on the second supporting bar is realized through the second locating holes at different positions. Therefore, the substrate storage rack had a simple structure that can be easily manufactured.

In a further technical solution, movement of the first limiting seat on the first supporting bar is realized through the first sliding chute, and similarly, movement of the second limiting seat on the second supporting bar is realized through the second sliding chute. Therefore, the first limiting seat and the second limiting seat can be positioned at any positions as required, so that the substrates with different sizes can be better laid. Therefore, the use range of the substrate storage rack can be further broadened.

In a further technical solution, by using the first roller arranged on the first limiting seat and the second roller arranged on the second limiting seat, the substrate not being laid in its correct position will transversely slide from the first roller or the second roller to the first supporting bar and the second supporting bar by means of gravity. Therefore, it can be ensured that the substrate will be placed in its correct position. Consequently, the laying precision of the substrates can be improved, and a good condition is provided for subsequent production.

In a further technical solution, the third supporting bar arranged on the third lateral surface of the rack body is matched with the first supporting bars and the second supporting bars, thus achieving a better effect of supporting the substrates. Therefore, the storage stability of the substrates in the rack body can be ensured.

In a further technical solution, through the movable third limiting seat that is arranged on the third supporting bar and can be adjusted and matched with the first limiting seat and the second limiting seat, the substrates with different sizes can be better laid, and the use range of the substrate storage rack can be further broadened.

In a further technical solution, movement of the third limiting seat on the third supporting bar can be achieved by using the third locating holes at different positions. Therefore, the substrate storage rack had a simple structure that can be easily manufactured.

In a further technical solution, movement of the third limiting seat on the third supporting bar can be achieved by using the third sliding chute, so that the third limiting seat can be placed at any position as required, so that the substrates with different sizes can be better laid. Therefore, the use range of the substrate storage rack can be further broadened.

In a further technical solution, by using the third arranged on the third limiting seat, the substrate not being laid in its correct position will longitudinally slide from the third roller to the third supporting bar by means of gravity. Therefore, it can be ensured that the substrate will be placed in its correct position. Consequently, the laying precision of the substrates can be improved, and a good condition is provided for subsequent production.

In a further technical solution, the first supporting rod is arranged at the second lateral surface of the rack body, and the second supporting rod is arranged at the fourth lateral surface. Therefore, the first supporting rod and the second supporting rod can play a role in supporting the rack body, so that the whole structural strength of the substrate storage rack can be improved.

The above-mentioned technical features may be combined in various appropriate modes or substituted by equivalent technical features, as long as the objectives of the present disclosure can be fulfilled.

BRIEF DESCRIPTION OF THE DRAWINGS

The present disclosure will be described in more detail below based on merely nonfinite examples with reference to the accompanying drawings. In the drawings.

LIST OF REFERENCE SIGNS

1—rack body; 11—first lateral surface, 12—second lateral surface, 13—third lateral surface. 14—fourth lateral surface;

2—substrate laying layer;
21—first support, 22—first supporting bar, 221—first locating hole, 222—first sliding chute;
23—second support, 24—second supporting bar, 241—second locating hole, 242—second sliding chute;
25—third support, 26—third supporting bar, 261—third locating hole, 262—third sliding chute;
3—first limiting seat, 31—first limiting portion, 311—first connecting mechanism, 32—first roller;
4—second limiting seat, 41—second limiting portion, 411—second connecting mechanism, 42—second roller;
5—third limiting seat, 51—third limiting portion, 511—third connecting mechanism, 52-third roller; and
6—first supporting rod; 7—second supporting rod.

DETAILED DESCRIPTION OF THE EMBODIMENTS

In order to enable the objects, technical solutions and advantages of the present disclosure more clearly, the technical solutions of the present disclosure will be described in a clear and complete manner hereinafter. All other embodiments obtained by one skilled in the art based on the embodiments as disclosed in the present disclosure without involvement of any creative work are deemed as falling within the protection scope of the present disclosure.

Figure 1:
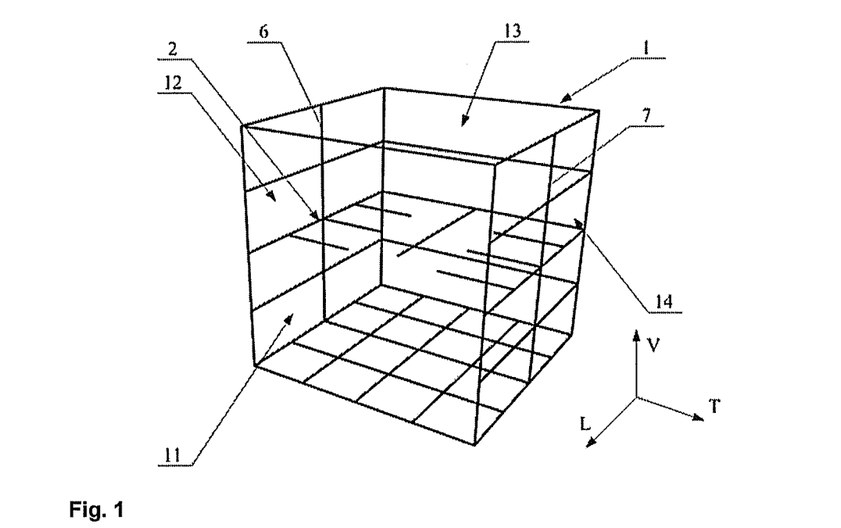
FIG. 1 is a structural schematic diagram of a substrate storage rack provided in an example of the present disclosure.

Before the specific embodiments are described, directional terms mentioned in the present disclosure are defined as follows. As shown in FIG. 1, in a rack body, a longitudinal direction L is the direction along the line perpendicular to a first lateral surface 11 and a third lateral surface 13, a transverse direction T is the direction along the line perpendicular to a second lateral surface 12 and a fourth lateral surface 14, and a vertical direction V is the direction along the line perpendicular to the bottom and the top of the rack body 1.

As shown in FIG. 1 to FIG. 11, a substrate storage rack provided in this example includes a hollow rack body 1, which has a first lateral surface 11 and a third lateral surface 13 opposite to each other, and a second lateral surface 12 and a fourth lateral surface 14 opposite to each other. At least one substrate laying layer 2 is arranged in the rack body 1, wherein the substrate laying layer 2 includes: a first support 21 connected with the rack body 1 and arranged at the second lateral surface 12; first supporting bars 22 transversely arranged on the first support 21 and extending to the interior of the rack body 1; a second support 23 connected with the rack body 1 and arranged at the fourth lateral surface 14; and second supporting bars 24 transversely arranged on the second support 23 and extending to the interior of the rack body 1.

When the substrate storage rack is used, substrates can be firstly laid on the substrate laying layer 2. Specifically, the first supporting bars 22 and the second supporting bars 24 are used to support and hold the substrates. When production starts and the substrate storage rack is placed at a fetching position, an automatic manipulator arm can take the substrates in the substrate storage rack out through the first lateral surface 11 of the rack body 1, and then transports the substrates to a production line. When manual production is needed, the substrate storage rack does not need to be taken out, and an operator can directly take the substrates out by hands through the third lateral surface 13 of the rack body 1. When substrates need to be stored in the substrate storage rack, the substrates can be stored in the substrate storage rack by using the automatic manipulator arm through the first lateral surface 11 of the rack body 1, or manually stored therein by manpower through the third lateral surface 13 of the rack body 1. Thus, bidirectional fetching and feeding of the substrates in the substrate storage rack are realized, and the production efficiency can be effectively improved.

In this example, a plurality of substrate laying layers 2 are arranged in sequence in the rack body 1 at intervals along the vertical direction, so that the quantity of substrates that can be stored in the substrate storage rack can be effectively improved by using the plurality of substrate laying layers 2. Consequently, the substrates can be used on the production line more conveniently.

Figure 3:
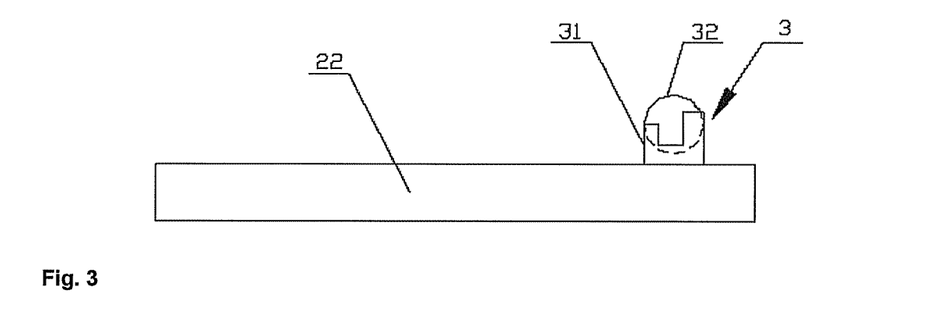
FIG. 3 is a schematic diagram of an assembled structure of a first limiting seat and a first supporting bar provided in an example of the present disclosure.
Figure 6:
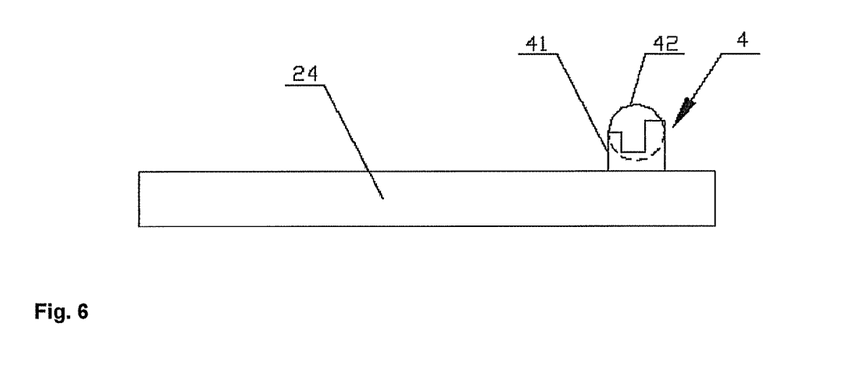
FIG. 6 is a schematic diagram of an assembled structure of a second limiting seat and a second supporting bar provided in an example of the present disclosure.

In an example, when the substrates are put on the substrate laying layer 2, the substrates are actually laid on the first supporting bar 22 and the second supporting bar 24. However, as the applications in which TFT-LCD can be used increase, the size of a substrate is continually changed. To adapt the substrate storage rack to storage of the substrates with different sizes so as to broaden the use range thereof, a first limiting seat 3 capable of moving along the transverse direction is arranged on each first supporting bar 22, and a second limiting seat 4 capable of moving along the transverse direction is arranged on each second supporting bar 24. The first limiting seat 3 includes a first limiting portion 31 that can restrict the substrate, and the second limiting seat 4 includes a second limiting portion 41 that can restrict the substrate, as shown in FIG. 3 and FIG. 6 respectively.

In use, according to the specific sizes of the substrates to be stored, the distance between the first limiting seat 3 and the second limiting seat 4 can be reduced or increased by adjusting the transverse position of the first limiting seat 3 on the first supporting bar 22 and the transverse position of the second limiting seat 4 on the second supporting bar 24, so as to achieve the storage of the substrates with different sizes. After the transverse positions of the first limiting seat 3 and the second limiting seat 4 are set, the substrate can be laid on the substrate laying layer 2, and held in it correct position through the first limiting portion 31 and the second limiting portion 41 at two transverse ends thereof. Thus, the storage stability of the substrates in the substrate laying layer 2 can be further ensured.

It should be noted that transverse movement between the first supporting bar 22 and the first limiting seat 3 indicates that the position of the first limiting seat 3 can be changed on the first supporting bar 22 along the transverse direction. However, it is not necessary to provide a sliding fit between the first limiting seat 3 and the first supporting bar 22. This also similarly applies to the second supporting bar 24 and the second limiting seat 4, which will not be described here for the sake of conciseness.

Figure 4:
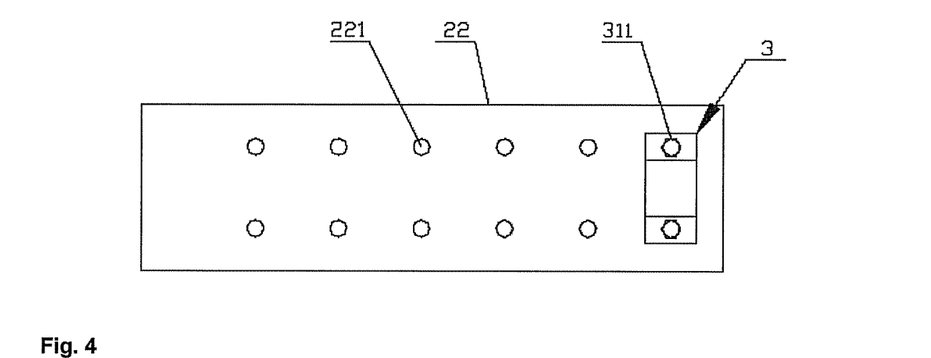
FIG. 4 is a top view of an assembled structure of the first limiting seat and the first supporting bar in FIG. 3.
Figure 7:
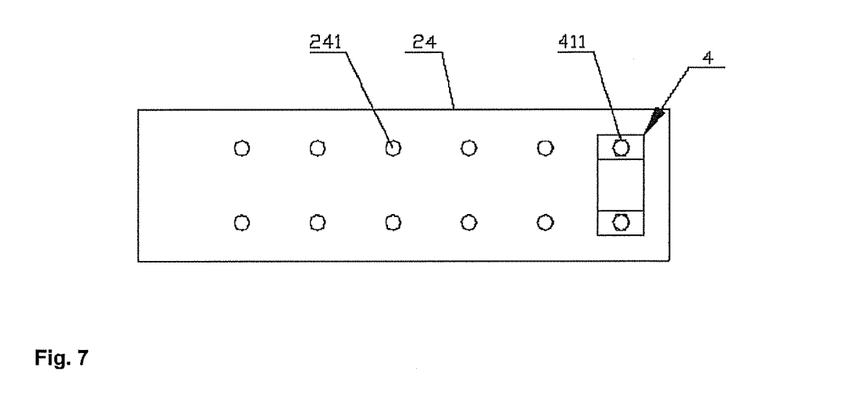
FIG. 7 is a top view of an assembled structure of the second limiting seat and the second supporting bar in FIG. 6.

Specifically, as shown in FIG. 4 and FIG. 7, a plurality of groups of first locating holes 221 are formed on each first supporting bar 22 at intervals along the transverse direction, and the corresponding first limiting seat 3 can be selectively matched and connected with one group of the first locating holes 221. In addition, a plurality of groups of second locating holes 241 are formed on each second supporting bar 24 at intervals along the transverse direction, and the corresponding second limiting seat 4 can be selectively matched and connected with one group of the second locating holes 241.

In use, the first liming seat 3 is first taken down from the first supporting bar 22, and then mounted on the first supporting bar 22 at a suitable position through the corresponding first locating holes 221 according to the specific size of the substrate. Therefore, the first liming seat 3 can move along the first supporting bar 22. Similarly, a second limiting seat 4 may also move along a second supporting bar 24, which will not be described here for the sake of conciseness. In this manner, the distance between the first limiting seat 3 and the second limiting seat 4 can be adjustable, in order to meet the requirement for laying substrates with different sizes.

Specifically, each first limiting seat 3 can be matched and connected with a group of the first locating holes 211 through a first connecting mechanism 311, and each second limiting seat 4 can be matched and connected with a group of the second locating holes 241 through a second connecting mechanism 411, wherein each first connecting mechanism 311 can be a projection arranged at the bottom of each first limiting seat 3, or one or more of a screw, a bolt and a pin. Therefore, the first connecting mechanism 311 can be designed with various structures, all of which should fall into the protection scope of the present disclosure. The second connecting mechanism 411 can be configured as the same as or similar to the first connecting mechanism 311, which will not be described here for the sake of conciseness.

However, with the above-mentioned connecting mode, the adjustable range of the first limiting seat 3 is relatively limited, and the corresponding mounting position thereof can be selected only according to the distribution of the first locating holes 221. Therefore, this connecting mode still has its own shortage. This also applies to the second limiting seat 4.

Figure 5:
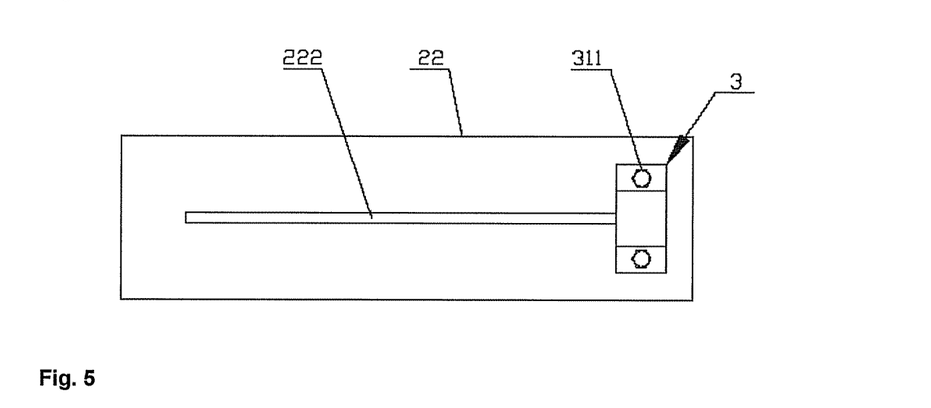
FIG. 5 is a top view of another assembled structure of the first limiting seat and the first supporting bar provided in an example of the present disclosure.
Figure 8:
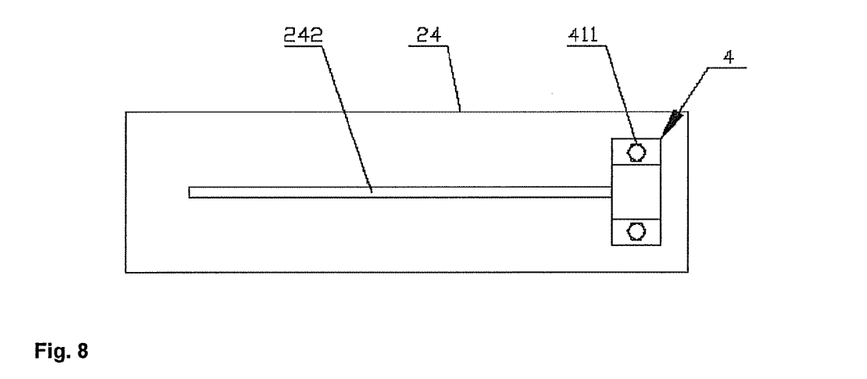
FIG. 8 is a top view of another assembled structure of the second limiting seat and the second supporting bar provided in an example of the present disclosure.

Therefore, in a further preferred example as shown in FIG. 5 and FIG. 8, a first sliding chute 222 is transversely formed on each first supporting bar 22, and the corresponding first limiting seat 3 can be matched and connected with the first supporting bar 22 through the first sliding chute 222. In addition, a second sliding chute 242 is transversely formed on each second supporting bar 24, and the corresponding second limiting seat 4 can be matched and connected with the second supporting bar 24 through the second sliding chute 242.

In use, the first limiting seat 3 can slide within the first sliding chute 222, so that the transverse position of the first limiting seat 3 can be adjusted. When the first limiting seat 3 moves to a position suitable for the substrate to be stored, the first limiting seat 3 is fixed to the first supporting bar 22 through the corresponding fixing mechanism. Similarly, the second limiting seat 4 may also move along a second supporting bar 24, which will not be described here for the sake of conciseness. In this manner, the distance between the first limiting seat 3 and the second limiting seat 4 can be also adjustable, in order to meet the requirement for placing substrates with different sizes. With such a connecting mode, the position of the first limiting seat 3 on the first supporting bar 22 in the transverse direction can be freely adjusted, so that the first limiting seat 3 can be held at any appropriate position. This also applies to the second limiting seat 4. Thus, the substrates with different sizes can be better matched and laid, and the use range of the substrate storage rack can be further broadened.

When the substrate is manually fed into the substrate storage rack by manpower through the third lateral surface 13, deviation in the position of the substrate may exist, such that the substrate may be not completely laid on the first supporting bar 22 and the second supporting bar 24. For example, one end of the substrate may be laid on the first limiting seat 3 or the second limiting seat 4. In this case, the precision of laying the substrates will be seriously affected, and the subsequent production will be also influenced. Therefore, in an example, on each first limiting seat 3 a first roller 32 is arranged, the axis of which extends longitudinally and the peripheral surface of which is tangential with the first limiting portion 31. In addition, on each second limiting seat 4 a second roller 42 is arranged, the axis of which extends longitudinally and the peripheral surface of which is tangential with the second limiting portion 41.

In use, when a substrate is manually laid on the substrate laying layer 2, supposing that one end of the substrate is laid on the first limiting seat 3, the bottom of the substrate will contact the peripheral surface of the first roller 32. At this moment, the substrate will slide off along the peripheral surface of the first roller 32 under the action of gravity, and then falls onto the first supporting bar 22. Then, the substrate is held in position through the first limiting portion 31 which is tangential with the peripheral surface of the first roller 32. This also applies to the second roller 42 on the second limiting seat 4, which will not be described here for the sake of conciseness.

By using the first roller 32 arranged on the first limiting seat 3 and the second roller 42 arranged on the second limiting seat 4, the substrate which is not laid in its correct transverse position will slide off from the first roller 32 or the second roller 42 to the first supporting bar 22 or the second supporting bar 24 by means of gravity, so that the substrate can be disposed correctly. Therefore, the laying precision of the substrates can be improved, thus providing a good condition for subsequent production.

Figure 2:
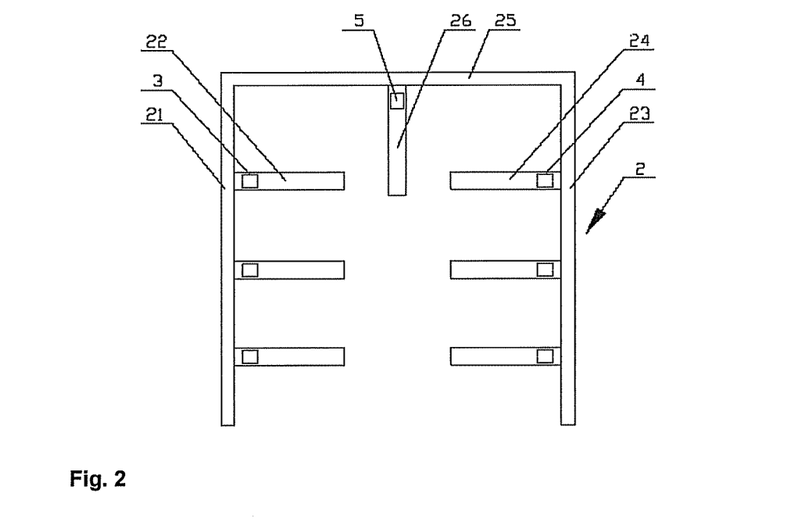
FIG. 2 is a structural schematic diagram of a substrate laying layer in the substrate storage rack provided in an example of the present disclosure.

Because the substrates with different sizes can be stored in the substrate storage rack, when the sizes of the substrates are too small, the contacting surface areas of the two transverse ends of the substrates with the first supporting bars 22 and the second supporting bars 24 respectively are relatively small. And since the substrates have a certain weight, a certain deformation will be generated in the middle portion of the substrates after both transverse ends of the substrates contact and restrict the first supporting bars 22 and the second supporting bars 24 respectively. Alternatively, after the sizes of the substrates are further reduced, both transverse ends of the substrates cannot simultaneously contact and restrict the first supporting bar 22 and the second supporting bar 24, so that the substrate storage rack cannot be effectively used for various substrates. Therefore, In an example, as shown in FIG. 2, the substrate laying layer 2 further includes at least one third supporting bar 26 longitudinally arranged on the third lateral surface 13 through a third support 25, and the third supporting bar 26 is arranged between the first supporting bars 22 and the second supporting bars 24 in the transverse direction.

In use, the third supporting bar 26 can cooperate with the first supporting bars 22 and the second supporting bars 24 to achieve a better effect of supporting the substrates. Meanwhile, when the substrates are simultaneously supported through the first supporting bars 22, the second supporting bars 24 and the third supporting bar 26, the storage stability of the substrates in the rack body 1 can be further ensured.

Figure 9:
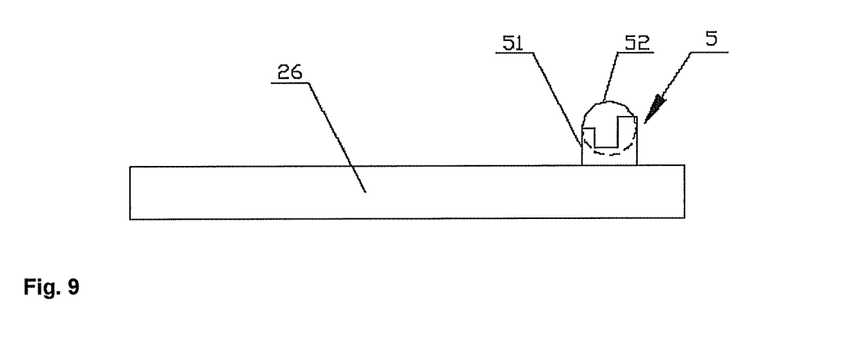
FIG. 9 is a schematic diagram of an assembled structure of a third limiting seat and a third supporting bar provided in an example of the present disclosure.

In this example, when the substrates are put on the substrate laying layer 2, the substrates are actually laid on the first supporting bar 22, the second supporting bar 24 and the third supporting bar 26. However, as the applications in which TFT-LCD can be used increase, the size of a substrate is continually changed. To adapt the substrate storage rack to storage of the substrates with different sizes so as to broaden the use range thereof, as shown in FIG. 9, a third limiting seat 5 capable of moving longitudinally is arranged on the third supporting bar 26, and the third limiting seat 5 includes a third limiting portion 51 that can restrict the substrates. The specific use mode and beneficial effect of the third limiting seat 5 can be the same as or similar to those of the first limiting seat 3 and the second limiting seat 4, and will not be described here for the sake of conciseness.

Figure 10:
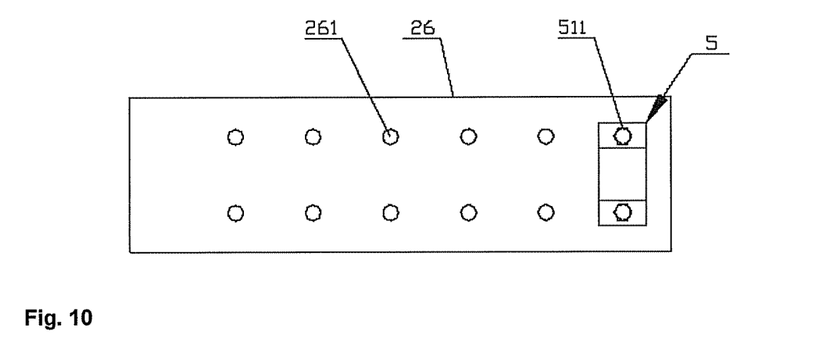
FIG. 10 is a top view of an assembled structure of the third limiting seat and the third supporting bar in FIG. 9.

Further, as shown in FIG. 10, a plurality of groups of third locating holes 261 are formed on the third supporting bar 26 at intervals along the longitudinal direction, and the third limiting seat 5 can be selectively matched and connected with one group of the third locating holes 261. The specific use mode and beneficial effect of the third limiting seat 5 and the third locating holes 261 are the same as or similar to those of the first limiting seat 3 and the first locating holes 221, and will not be described here for the sake of conciseness.

Specifically, the third limiting seat 5 is matched and connected with the third locating holes 261 through a third connecting mechanism 511, wherein the third connecting mechanism 511 can be the same as or similar to the first connecting mechanism 311, and will not be described here for the sake of conciseness.

However, with the above-mentioned connecting mode, the adjustable range of the third limiting seats 5 is relatively limited, and the corresponding mounting positions can be selected only according to the distribution of the third locating holes 261. Therefore, this connecting means still has its limitation.

Figure 11:
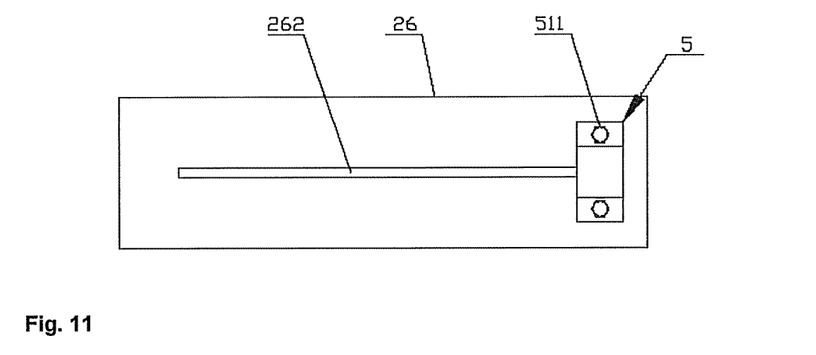
FIG. 11 is a top view of another assembled structure of the third limiting seat and the third supporting bar provided in an example of the present disclosure.

Therefore, in a further preferred example, as shown in FIG. 11, a third sliding chute 262 is longitudinally formed on the third supporting bar 26, and the corresponding third limiting seat 5 can be matched and connected with the third supporting bar 26 through the third sliding chute 262. The specific use mode and beneficial effect of the third limiting seat 5 and the third sliding chute 262 can be the same as or similar to those of the first limiting seat 3 and the first sliding chute 222, and will not be described here for the sake of conciseness.

In this example, when the substrate is manually fed into the substrate storage rack through the third lateral surface 13, deviation in the position of the substrate may exist, such that the substrate cannot be completely laid on the third supporting bar 26, for example. In this case, the precision of laying the substrate will be seriously affected, and the subsequent production will be also influenced. To this end, on the third limiting seat 5a a third roller 52 is arranged, the axis of which extends transversely and the peripheral surface of which is tangential with the third limiting portion 51. The specific use mode and beneficial effect of the third limiting seat 5 and the third roller 52 can be the same as or similar to those of the first limiting seat 3 and the first roller, and will not be described here for the sake of conciseness.

In an example, the rack body 1 may be further provided with at least one first supporting rod 6 at the second lateral surface 12 along the vertical direction, and at least one second supporting rod 7 at the fourth lateral surface 14 along the vertical direction. The first supporting rod 6 is connected and fixed to the first support 21, and the second supporting rod 7 is connected and fixed to the second support 23. The first supporting rod 6 arranged at the second lateral surface 12 of the rack body 1 and the second supporting rod 7 arranged at the fourth lateral surface 14 can assist in supporting the rack body 1, so that the whole structural strength of the substrate storage rack can be improved.

It should be noted that the preceding embodiments and examples are merely used for illustrating the technical solutions of the present disclosure, rather than limiting the present disclosure. Though the present disclosure is illustrated in detail with reference to the preceding embodiments and examples, it should be understood by those of ordinary skill in the art that modifications may still be made to the technical solutions recorded in the preceding embodiments or examples, or equivalent alterations may be made to a part of technical features thereof; and these modifications or alterations will not render the nature of corresponding technical solutions depart from the spirit and scope of the technical solutions of the embodiments or examples of the present disclosure.

The invention claimed is:

1. A substrate storage rack, including a hollow rack body with a first lateral surface and a third lateral surface opposite to each other, and a second lateral surface and a fourth lateral surface opposite to each other, wherein
at least one substrate laying layer is arranged in the rack body, and includes:
a first support connected with the rack body and arranged at the second lateral surface;
first supporting bars transversely arranged on the first support and extending to the interior of the rack body;
a second support connected with the rack body and arranged at the fourth lateral surface; and
second supporting bars transversely arranged on the second support and extending to the interior of the rack body;
a first limiting seat capable of moving transversely is arranged on each first supporting bar, and the first limiting seat includes a first limiting portion that can restrict the substrate;
a second limiting seat capable of moving transversely is arranged on each second supporting bar, and the second limiting seat includes a second limiting portion that can restrict the substrate;
a plurality of groups of first locating holes are formed on each first supporting bar at intervals along the traverse direction, and each first limiting seat can be selectively matched and connected with one group of the first locating holes; and
a plurality of groups of second locating holes are formed on each second supporting bar at intervals along the traverse direction, and each second limiting seat can be selectively matched and connected with one group of the second locating holes;
wherein a first sliding chute is transversely formed on each first supporting bar, and the corresponding first limiting seat can be matched and connected with the first supporting bar through the first sliding chute; and
a second sliding chute is transversely formed on each second supporting bar, and the corresponding second limiting seat can be matched and connected with the second supporting bar through the second sliding chute.

2. The substrate storage rack according to claim 1, wherein a plurality of substrate laying layers are distributed in sequence within the rack body and spaced from each other at intervals along the vertical direction.

3. The substrate storage rack according to claim 1, wherein on each first limiting seat a first roller is arranged, the axis of which extends longitudinally and the peripheral surface of which is tangential with the first limiting portion; and
on each second limiting seat a second roller is arranged, the axis of which extends longitudinally and the peripheral surface of which is tangential with the second limiting portion.

4. The substrate storage rack according to claim 1, wherein the substrate laying layer further includes at least one third supporting bar longitudinally arranged on the third lateral surface through a third support, and the third supporting bar is arranged between the first supporting bars and the second supporting bars along the transverse direction.

5. The substrate storage rack according to claim 4, wherein a third limiting seat capable of moving longitudinally is arranged on the third supporting bar, and the third limiting seat includes a third limiting portion that can restrict the substrate.

6. The substrate storage rack according to claim 5, wherein a plurality of groups of third locating holes are formed on the third supporting bar at intervals along the longitudinal direction, and the third limiting seat can be selectively matched and connected with one group of the third locating holes.

7. The substrate storage rack according to claim 5, wherein a third sliding chute is longitudinally formed on the third supporting bar, and the third limiting seat can be matched and connected with the third supporting bar through the third sliding chute.

8. The substrate storage rack according to claim 5, wherein on the third limiting seat a third roller is arranged, the axis of which extends transversely and the peripheral surface of which is tangential with the third limiting portion.

9. The substrate storage rack according to claim 1, wherein the rack body is provided with at least one vertically-arranged first supporting rod at the second lateral surface, and the first supporting rod is connected and fixed to the first support; and the rack body is provided with at least one vertically-arranged second supporting rod at the fourth lateral surface, and the second supporting frame is connected and fixed to the second support.

* * * * *